United States Patent [19]

McElroy

[11] 4,336,647
[45] Jun. 29, 1982

[54] METHOD OF MAKING IMPLANT PROGRAMMABLE N-CHANNEL READ ONLY MEMORY

[75] Inventor: David J. McElroy, Houston, Tex.

[73] Assignee: Texas Instruments Incorporated, Dallas, Tex.

[21] Appl. No.: 106,126

[22] Filed: Dec. 21, 1979

[51] Int. Cl.³ .................... H01L 21/425; G11C 11/40
[52] U.S. Cl. .................... 29/571; 29/576 B; 148/1.5; 148/187; 357/41; 357/59; 357/91
[58] Field of Search ............ 148/1.5, 187; 29/571, 29/576 B; 357/41, 59, 91

[56] References Cited

U.S. PATENT DOCUMENTS

| | | | |
|---|---|---|---|
| 4,080,718 | 3/1978 | Richman | 29/571 |
| 4,129,936 | 12/1978 | Takei | 29/571 |
| 4,176,442 | 12/1979 | Bischoff et al. | 29/571 |
| 4,180,826 | 12/1979 | Shappir | 29/571 |
| 4,208,780 | 6/1980 | Richman | 29/578 |
| 4,230,504 | 10/1980 | Kuo | 148/1.5 |
| 4,235,010 | 11/1980 | Kawagoe | 29/571 |
| 4,257,826 | 3/1981 | Matalone, Jr. | 148/1.5 |
| 4,257,832 | 3/1981 | Schwabe et al. | 148/1.5 |

*Primary Examiner*—Upendra Roy
*Attorney, Agent, or Firm*—John G. Graham

[57] ABSTRACT

An MOS read only memory or ROM formed by the standard N-channel silicon gate manufacturing process uses a cell structure which allows implant programming after the metal level of contacts and interconnections has been deposited and patterned. Address lines and gates are polysilicon strips and output and ground lines are metal strips perpendicular to the address lines; these metal strips make contact to the sources and drains defined by N+ regions. Each potential MOS transistor in the array is programmed to be a logic "1" or "0" by selective ion implant through the polysilicon gates and thin gate oxide, using photoresist as a mask, after application of the metal level. The ion implant is not required to penetrate through the metal lines.

11 Claims, 15 Drawing Figures

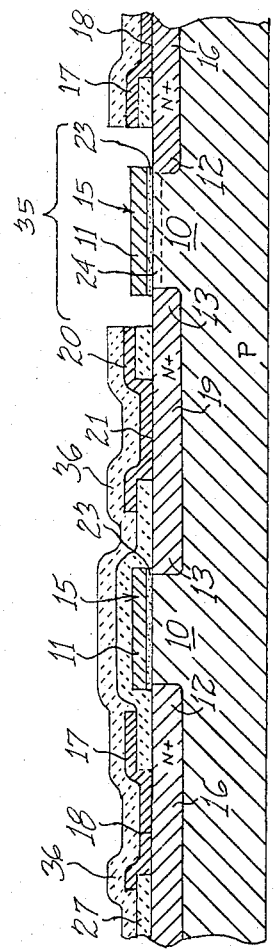

4,336,647

METHOD OF MAKING IMPLANT PROGRAMMABLE N-CHANNEL READ ONLY MEMORY

BACKGROUND OF THE INVENTION

This invention relates to semiconductor memory devices, and more particularly to an N-channel silicon gate MOS read only memory and a process for making it.

Storage of fixed programs in digital systems is often by MOS read only memory devices or "ROMs". ROMs are made by semiconductor manufacturers on special order, with the programming code being specified by the customer. The manufacturing process is lengthy, requiring dozens of steps, each taking up time and introducing materials handling and inventory factors. The turnaround time between receipt of the ROM code for a custom order and delivery of finished parts must be kept as short as possible. For this reason, programming should be done late in the manufacturing process, such as by the "implant through poly" method as disclosed in pending applications Ser. Nos. 890,555; 890,557; 900,549 (U.S. Pat. No. 4,230,504), and 1,571 (U.S. Pat. No. 4,294,001), filed by C-K Kuo, assigned to Texas Instruments, or U.S. Pat. No. 4,129,936. Programming the ROM by ion implant through polysilicon gates allows the program step to be done after most of the steps in the manufacturing process have been completed.

The economics of manufacture of ROMs and of mounting them on circuit boards in a system require that the number of memory bits per semiconductor chip be as high as possible. Within a few years, standard ROM sizes will exceed 1 megabit per chip, dictating that the cell size for the storage cells of the ROM be quite small. Most microprocessor and computer parts are now made by the N-channel silicon gate process because of the higher speed or shorter access time provided. The N-channel process has not been favorable to layout of ROM cells of small size in a structure compatible with implant programming. The above-mentioned applications or patent show devices which require nonstandard N-channel processing, or result in excessive cell size.

It is the principal object of this invention to provide a semiconductor permanent store memory cell of small size made by standard processing which may be programmed at a late stage in the manufacturing process. Another object is to provide a small-area MOS ROM cell which is made by a process compatible with standard N-channel silicon gate manufacturing techniques and is programmable after the metal interconnections have been applied and patterned.

SUMMARY OF THE INVENTION

In accordance with an embodiment of the invention, a metal-oxide-semiconductor read only memory, or MOS ROM, formed by the standard N-channel silicon gate manufacturing process uses a cell structure which allows implant programming after the metal level of contacts and interconnections has been deposited and patterned. Address lines and gates are polysilicon strips and output and ground lines are metal strips perpendicular to the address lines; these metal strips make contact to the sources and drains defined by N+ regions. Each potential MOS transistor in the array is programmed to be a logic "1" or "0" by selective ion implant through the polysilicon gates and thin gate oxide, using photoresists as a mask, after application of the metal level. The ion implant is not required to penetrate through the metal lines.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings FIGS. 1-5, wherein:

FIG. 5 is another embodiment corresponding to FIG. 3A according to present invention.

DETAILED DESCRIPTION OF SPECIFIC EMBODIMENTS

Figure 1:
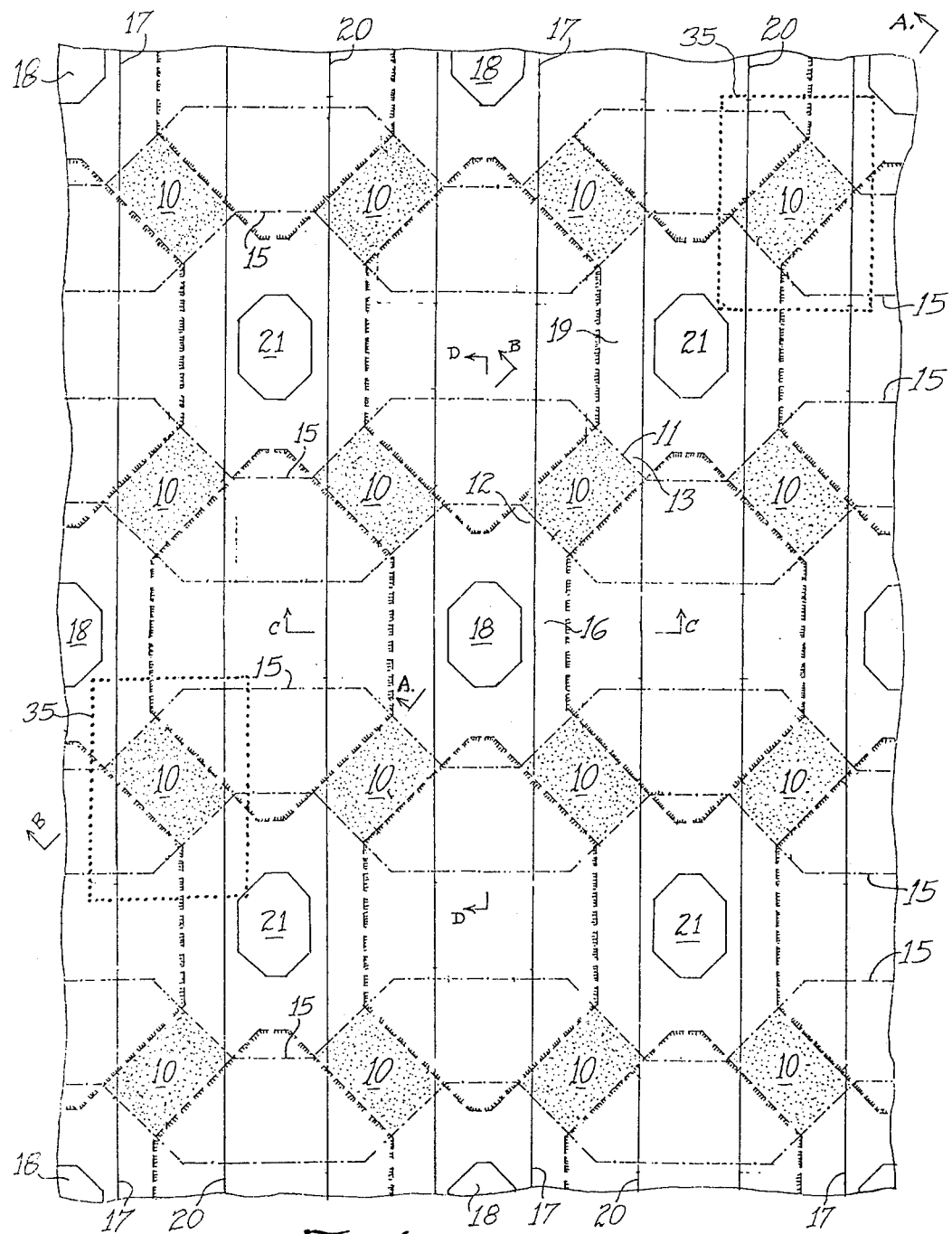
FIG. 1 is a greatly enlarged plan view of a small portion of a semiconductor chip showing the physical layout of a part of a ROM array made according to the invention.
Figure 2:
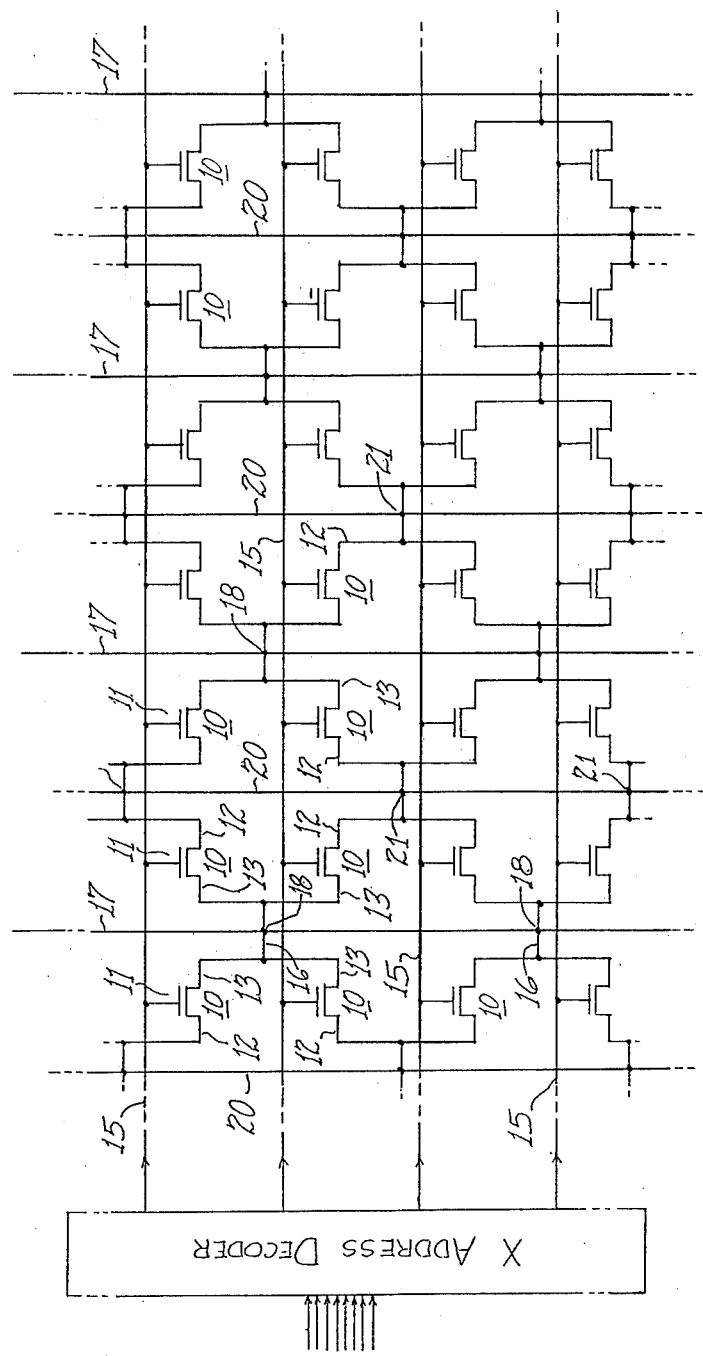
FIG. 2 is an electrical schematic diagram of the ROM of FIG. 1.

With reference to FIGS. 1, 2, and 3A-3D, a read only memory is illustrated which is programmed according to the invention. The array consists of a large number of cells 10, only sixteen of which are shown. Each cell is an MOS transistor having a gate 11, a source 12 and a drain 13. The gates 11 are parts of polysilicon strips 15 which are the X address lines for the array. The sources are part of N+ diffused common regions 16 which are connected to metal output/ground lines 17 at contact areas 18, while the drains are part of N+ diffused common regions 19 which are likewise connected to metal output/ground lines 20 at contact areas 21. The array, formed on a silicon bar 22, would typically contain perhaps 64K, 128K or 256K cells, and the bar would be less than about 150 mils on a side, depending upon the bit density. The sixteen cells 10 shown would be on a minute part of the bar, perhaps one or two mils wide. A 64K ROM would require 256 of the X address lines 15 and 256 of the Y or output/ground lines like the lines 17 and 20, providing 65,536 bits. The array is of a virtual ground type; virtual ground ROMs are discussed in U.S. Pat. No. 3,934,233, issued to Roger J. Fisher and Gerald D. Rogers or U.S. Pat. No. 4,021,781 issued to Edward R. Caudel, both assigned to Texas Instruments, in which case one Vss line for each eight or sixteen Y lines is used; however, here a virtual ground arrangement is used wherein no dedicated ground lines are present, but instead one Y line 17 or 20 is selected as ground, depending upon the Y address, and an adjacent one is the output line. Although the terms "source" and "drain" are used to refer to specific regions, it is noted that the terms and regions are interchangeable. The same region could function as source at one time and drain at another.

The cell array is programmed by boron implant through the polycrystalline silicon strips 15 and a thin gate oxide layer 23 at areas between the metal strips 17 and 20 to raise the threshold voltage of selected ones of the cells 10 to a value above that which will be turned on by the voltage on the selected address line 15. In the example of sixteen cells shown, in a typical ROM program some of the cells are implanted in this manner, and others are not. A photoresist coating, or a thick protective overcoat layer, is used as the implant mask, as will be explained. Apertures are formed in the mask above the cells 10 which are to be implanted. The ion implant creates more heavily doped regions 24 in the channel areas of the selected transistors 10. These regions 24 are more heavily P-type than the original silicon substrate 22.

As seen in FIGS. 3A–3D, a thick field oxide coating 25 covers parts of the bar 22 not occupied by the transistors or N+ diffused interconnects, and P+ channel stop regions 26 are formed underneath all the thick field oxide. A deposited oxide coating 27 covers the polysilicon strips 15 and all parts of the face except the contact areas 18 and 21.

The advantage of the cell structure shown is that the gates 11 are not covered by the metal strips 17 and 20, so the ion implant programming step can be done after the metal level has been deposited and patterned, thus postponing the stage in the manufacturing process at which the slices must be handled uniquely.

Turning now to FIGS. 4a–4d, a process for making the ROM array of the invention will be described. The starting material is a slice of P-type monocrystalline silicon, typically 4 inches in diameter and twenty mils thick, cut on the <100> plane, of a resistivity of about 6 to 8 ohm-cm. In the FIGURES the portion shown of the bar 22 represents only a very small part of the slice, perhaps 1 or 2 mils wide. After appropriate cleaning, the slice is oxidized by exposing to oxygen in a furnace at an elevated temperature of perhaps 1100° C. to produce an oxide layer 31 over the entire slice of a thickness of about 1000 Å. Next, a layer 32 of silicon nitride of about 1000 Å thickness is formed over the entire slice by exposing to an atmosphere of dichloro silane and ammonia in a reactor. A coating of photoresist is applied to the entire top surface of the slice, then exposed to ultraviolet light through a mask which defines the desired pattern of the thick field oxide 25 and the P+ channel stop 26. The resist is developed, leaving areas where nitride is etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 26, whereby boron atoms are introduced into unmasked regions 33 of silicon. This implant is at a dosage of about $10^{13}$ per sq. cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 4:
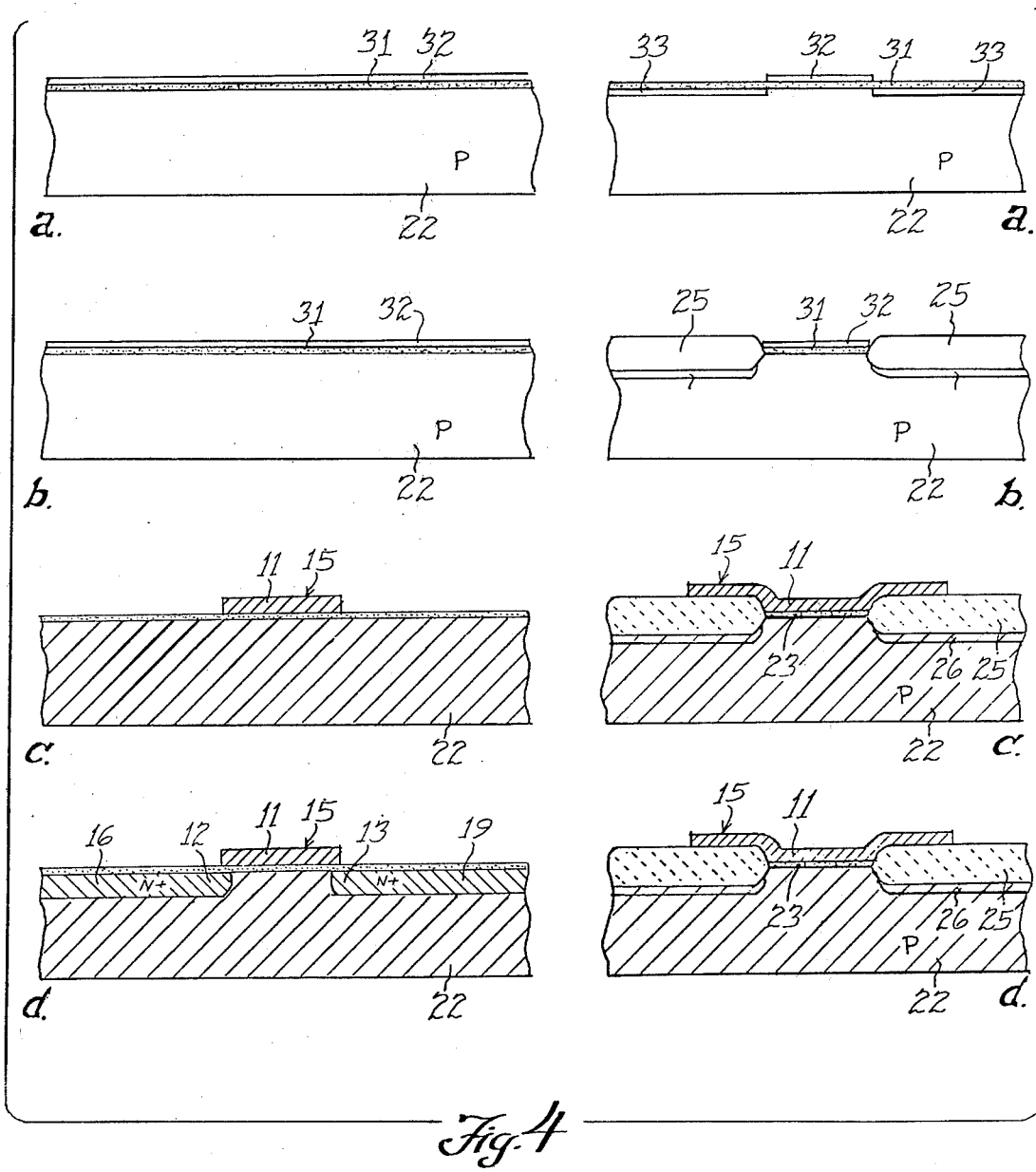
FIGS. 4a-4d are elevation views in section of the ROM array of FIGS. 1 and 3A-3D, at successive stages in the manufacturing process, taken generally along the lines a—a and b—b in FIG. 1.

The next step in the process is formation of field oxide 25, which is done by subjecting the slices to steam or an oxidizing atmosphere at about 900° C. for perhaps ten hours. This causes a thick field oxide layer 25 to be grown as seen in FIG. 4b. This region extends into the silicon surface because silicon is consumed as it oxidizes. The remaining parts of the nitride layer 32 mask oxidation. The thickness of this layer 25 is about 10,000 Å, about half of which is above the original surface and half below. The boron doped P+ regions 33 formed by implant will be partly consumed, but will also diffuse further into the silicon ahead of the oxidation front to produce P+ field stop regions 26 much deeper than the original regions 33.

Next the remaining nitride layer 32 is removed by an etchant which attacks nitride but not silicon oxide, then the oxide 31 is removed by etching, and the exposed silicon cleaned. The gate oxide layer 23 is grown by thermal oxidation to a thickness of about 500 to 800 Å.

In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for polysilicon to silicon contacts, if needed, are patterned and etched at this point using photoresist; none are needed in the ROM array itself.

As seen in FIG. 4c a layer of polycrystalline silicon is deposited over the entire slice in a reactor using standard techniques. Since the implant for programming penetrates this layer of photoresist, the thickness may be only about 3000 Å, compared to about 5000 in the usual silicon gate process, although with higher implant energy the full thickness can be used. This layer is doped with arsenic or phosphorus by the later N+ implant or diffusion to make it highly conductive. The polysilicon layer is patterned by applying a layer of photoresist, exposing to ultraviolet light through a mask prepared for this purpose, developing, then etching away the polysilicon which is not covered. The remaining photoresist masks certain areas of the polysilicon to define lines 15 in the cell array, as well as the gates of peripheral transistors and connections to contacts and other such parts of the circuit on the chip.

Using the polysilicon gates, and the photoresist which defined them, as a mask, the slice is subjected to an arsenic implant to create the N+ source and drain regions 12 and 13 and the common regions 16 and 19. A high temperature treatment after implant drives the impurities into the silicon to the proper junction depth. The resulting structure is seen in FIG. 4d. A phosphorus diffusion may be used instead of the arsenic implant, in which case the oxide 23 is etched after the polysilicon is etched.

The thick layer 27 oxide is now deposited by low temperature decomposition of silane at about 400° C. This layer 27 insulates the metal strips 17 and 20 from the polysilicon level of interconnections, and is referred to as multilevel oxide.

Figure 3:
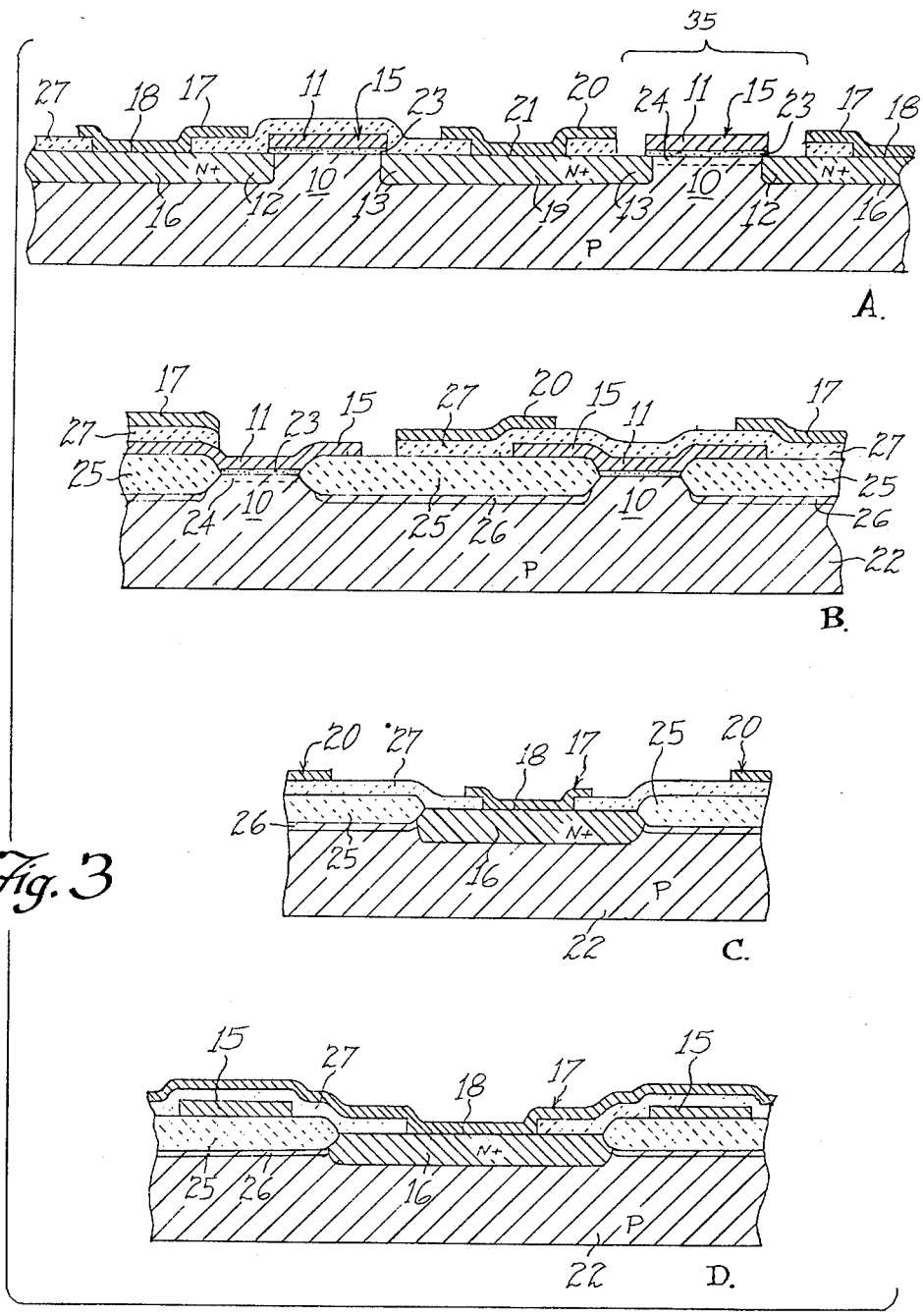
FIGS. 3A-3D are elevation views in section of the cell of FIG. 1, taken along the lines a—a, b—b, c—c, and d—d, respectively.

Referring to FIG. 3, the multilevel oxide layer 27 is now patterned by a photoresist operation, exposing the contact areas 18 and 21 for metal-to-silicon contacts. Metal contacts and interconnections are used in the periphery of the chip in the input buffers, decoders, sense amplifiers and the like, as well as for the bonding pads which provide connection to external electrodes. The metal contacts and interconnections are made in the usual manner by depositing a thin film of aluminum over the entire top surface of the slice then patterning it by a photoresist mask and etch sequence to leave the metal strips 17 and 20.

Up to this point in the process all slices are exactly the same as no programming has been done in the ROM array. The slices are processed routinely to this stage with no requirement for separate inventory controls and separate identification of each lot. An inventory of slices finished up through metal patterning may be maintained for quick response to custom orders for ROM codes.

In accordance with the primary feature of the invention, referring to FIG. 1, the ROM array is programmed by first depositing a photoresist layer over the entire slice, then patterning it by a photoresist mask and etch sequence using a unique mask which defines the ROM code. An aperture 35 is defined over each cell 10 to be programmed as a "0", and the oxide 27 is etched in each aperture 36. The slice is then subjected to a boron implant at about 180 KeV to a dosage of about $10^{13}$ per sq. cm. The energy level and dosage are dependent upon the thickness of the oxide layer 23 and the polysilicon gates 11, as well as the change in threshold desired. At this level, the ion implant penetrates the polycrystalline silicon gate 11 and gate oxide 23 to create an implanted region 24 in the channel area of selected cells. This implant raises the threshold voltage above about 5 V and since the part operates on a supply voltage Vdd of 5 V, the full logic 1 level will not turn on the transistor. The transistors covered by the photoresist will not be implanted so will retain the usual threshold voltage of about 0.8 V. The mask is non-critical because the active channel area to be implanted has already been defined in previous processing step with thin gate oxide 23. A moderately high temperature operation such as the temperature used for sintering the aluminum level, perhaps 460° C., is performed after the programming implant to activate the implanted ions.

In operation, an X address selects one of the lines 15 out of the 256 such lines in a 64K ROM, and this selected line is held at logic 1 level or about +5 V. The remaining lines are held at Vss, logic 0. The Y address selects one of the 256 lines such as 17 and 20 (depending upon the decode scheme) and this line is connected via the Y decoder to the output while an adjacent line is connected to Vss. The Y output lines may be precharged prior to an access cycle, so the selected line would conditionally discharge depending upon whether the selected bit at the intersection of the addressed X and Y lines is programmed a 1 or a 0.

In the above description, a photoresist coating after metal patterning is used as the program mask, but in another embodiment seen in FIG. 5, which corresponds to FIG. 3A, overcoating 36 usually applied after the metal may be used as the implant mask for programming. Using the photoresist step usually employed to uncover the bonding pads, the holes 35 would be etched in the protective oxide overcoat 36 and continuing through the interlevel oxide 27 where cells are to be implanted. The advantage of programming using the protective overcoat 36 is that this is literally the last mask step; it might be suitable where the protective oxide serves primarily as a scratch shield, e.g., in a hermatic package. Protective overcoat programming results in some cells in the array being left without a covering of thick protective overcoat; this might be detrimental after a long period of time in some environments. So, photoresist is preferred as the implant mask, in most cases, because this photoresist step is done prior to the steps of deposition of the protective overcoat in the conventional manner and patterning protective overcoat to expose only the bonding pads.

The purpose of the ion implant for programming the cell array is to change the threshold voltage of some of the transistors 10 relative to the others, depending upon whether a 1 or a 0 is to be stored. A ROM cell can be either normally on or normally off when selected. The feature of this invention can be used in either P-channel or N-channel ROMs, so, depending on channel type and whether the cells are to be normally on or normally off when selected, the proper type of dopant for ion implant is determined. In the embodiment described in detail above, a boron implant is used to increase the threshold voltage such that a transistor 10 is off when selected.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making a read-only-memory comprising the steps of:

forming a plurality of insulated gate field effect transistors in a face of a semiconductor body, each of the transistors having a source, a drain and a polysilicon gate, the transistors being in a regular pattern of rows and columns to provide an array of memory cells, metal column lines extending along said face and making electrical contact to all of the sources and drains;

masking said face to expose areas above selected ones of said gates and cover the gates of other of the transistors, and thereafter ion-implanting to program the array of memory cells by the masked ion implant in areas between the metal lines and penetrating through the gates of said selected ones of the field effect transistors.

2. A method according to claim 1 wherein the step of ion implanting uses a mask applied after said metal column lines have been formed.

3. A method according to claim 1, wherein the step of ion implanting uses a mask comprising a patterned coating of photoresist.

4. A method according to claim 2 wherein the ion implanting step is after the metal is deposited and patterned, and wherein the semiconductor body is P-type silicon, the sources and drains are N-type, and the ion implant is P-type.

5. A method of making a read-only-memory comprising which includes the steps of:

forming a plurality of insulated gate field effect transistors in a face of a semiconductor body, each of the transistors having a source, a drain and a conductive gate, the transistors being in a regular pattern of rows and columns to provide an array of memory cells, a plurality of conductive strips forming said gates and degining row lines; forming a plurality of metal column lines on said face making electrical contact to the sources and drains of the transistors;

ion-implanting selected areas of said face to program the array of memory cells by ion implant between the metal column lines and through the conductive gates of selected ones of the field effect transistors at said selected areas using a mask applied after said metal column lines have been formed.

6. In a method according to claim 5, the conductive gates and conductive strips being polycrystalline silicon, the semiconductor body being P-type silicon, the sources and drains being N-type, and the ion implant being P-type, and wherein the step of programming uses an etch mask comprising a coating of photoresist.

7. A method of making a semiconductor device comprising the steps of:

forming a plurality of circuit elements in a face of a semiconductor body, each of the circuit elements having electrodes in the face and a control electrode overlying the face; forming a plurality of conductive strips on said face which contact said electrodes in said face; and introducing impurity material into said face to change the characteristics of the circuit elements by implant between adjacent conductive strips and through the control electrodes of selected ones of the circuit elements using a mask.

8. A method according to claim 7 wherein the control electrodes are polycrystalline silicon in the form of elongated lines.

9. A method according to claim 8 wherein the conductive strips are metal lines perpendicular to said elongated lines.

10. A method according to claim 9 wherein the circuit elements are silicon gate field effect transistors and said metal lines are formed by metal deposited in a thin film and patterned prior to the implant.

11. A method according to claim 10 wherein the semiconductor body is P-type silicon, sources and drains of the transistors being N-type, and the ion implant being P-type.

* * * * *